United States Patent
Criss-Puszkiewicz et al.

(10) Patent No.: US 6,280,318 B1
(45) Date of Patent: Aug. 28, 2001

(54) CENTRAL FORCED AIR COOLING OF A GAMING MACHINE

(75) Inventors: Cynthia Rae Criss-Puszkiewicz, Reno; John Leagh Beadel, Sparks; Paul Scott Haefeli, Sun Valley; Gregory Hopkins Parrott; Kirk Arnim Tedsen, both of Reno, all of NV (US)

(73) Assignee: International Game Technology, Reno, NV (US)

( * ) Notice: Subject to any disclaimer, the term of this patent is extended or adjusted under 35 U.S.C. 154(b) by 0 days.

(21) Appl. No.: 09/510,710

(22) Filed: Feb. 22, 2000

(51) Int. Cl.[7] .................................................. H05K 5/00
(52) U.S. Cl. ............................................ 454/184; 361/695
(58) Field of Search .............................. 454/184; 361/695

(56) References Cited

U.S. PATENT DOCUMENTS 5,523,917 * 6/1996 Searby .................................. 361/695
5,559,673 * 9/1996 Gagnon et al. ...................... 454/184

* cited by examiner

Primary Examiner—Jiping Lu
(74) Attorney, Agent, or Firm—Beyer Weaver & Thomas LLP (57) ABSTRACT

A system and method is provided for cooling a gaming machine. The cooling system includes an air flow assembly which draws fresh air from outside the gaming machine. The air flow assembly provides the fresh air to a set of ducts. The set of ducts channel the fresh air to one or more internal components of the gaming machine. The cooling system may also include an inlet duct to channel air from outside the machine to the air flow assembly and filters for cleaning the air entering the gaming machine.

39 Claims, 4 Drawing Sheets

CENTRAL FORCED AIR COOLING OF A GAMING MACHINE

TECHNICAL FIELD

This present invention relates, generally, to cooling systems for gaming devices and, more particularly, relates to cooling systems which provide fresh air for cooling internal components of a gaming machine.

BACKGROUND ART

As technology in the gaming industry progresses, the once traditional mechanically-driven reel slot machines have been replaced with electronic counterparts having CRT video displays or the like. These video/electronic gaming advancements enable the operation of more complex gambling games which would not otherwise be possible on mechanical-driven gambling machines. For example, in addition to reel slot machines, it is now common to observe stand alone or multiple platform video electronic games including Keno, Blackjack, Poker, Pai Gow, and all the variations thereof, in even the smallest gaming establishments. These electronic game devices may comprise numerous internal electrical components including, for example, a power supply, a lighted display and a CPU. During extensive use, and due to the fact that these game devices are always "on" even when not in use, many of the internal electrical components thereof require cooling.

Figure 1:
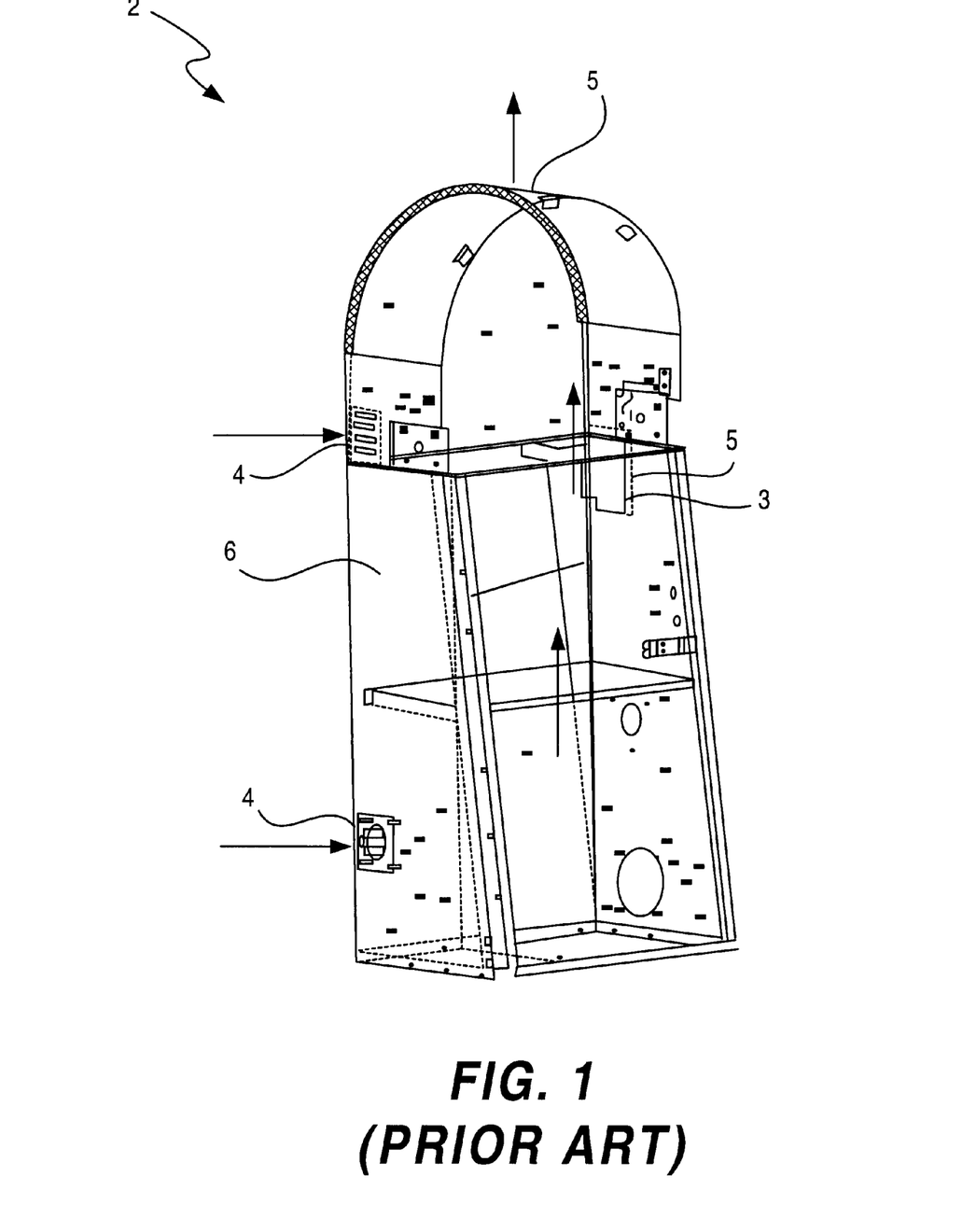
FIG. 1 is a side perspective view of a prior art gaming machine incorporating conventional box fans to cool the internal elements of the gaming machine.

FIG. 1 illustrates a conventional gaming machine which, currently, are typically cooled using at least one box fan 3. The box fan 3 is located within the gaming machine 2 and strategically placed on or near internal components requiring cooling, depending on space provisions. The box fan 3 distributes air from within the machine for convection cooling thereof. Typically, a housing 6 of the gamine machine 2 includes an air intake vent 4 to introduce fresh air to the internal components in the gaming machine. Typically, top boxes and base cabinets of a gaming machine are cooled separately. Therefore, it is common to have intake and exhaust ports for the top box and base cabinet, respectively. The housing 6 further includes an air exhaust vent 5 to exhaust air from the gaming machine. Generally, the air intake vent 4 and air exhaust vent 5 are spaced-apart along the side face of the housing to enable air circulation across the internal components. Vent location, however, is often dictated by space limitations.

Accordingly, during operation of the fan 3, the air is drawn into the housing 6 through intake part 4. After flowing past the internal components, the air exits the housing through exhaust port 5. As a consequence of this arrangement, the air driven by the box fan 3 is limited to the air that has circulated through the internal components, both electrical and mechanical, in the gaming machine interior. Correspondingly, the air may be heated by internal components before the air reaches other heat critical components. By way of example, the air may be heated by a monitor or coin hopper closer to the air inlet 4 before the air reaches a CPU proximate to the box fan 3. As some internal components may be more heat sensitive, this pre-heating of cooling air used by the box fan 3 may diminish heat removal for the heat sensitive components.

Another problem associated with this design is that internal particulates and contaminates can often be passed from one internal component to another internal component due to the common circulation of the air. For example, within the gaming machine housing 6, there is often an accumulation of coin dust and other particulates generated from the action of coins with the coin hopper. This dust often consists of metallic particles such as nickel and copper from the coins, and stainless steel from the hopper. As a result, this conductive dust complicates the cooling of internal components. More specifically, the box fan 3 circulates the coin dust from within the gaming machine and then distributes and deposits it onto the components being cooled, as well as other internal components which do not require cooling. Such deposition of these conductive particulates may compromise the operation of sensitive components within the gaming machine, and may even cause shorting of circuitry.

In an attempt to remove the coin dust, filters have been strategically positioned in the housing 6. Unfortunately, heavily trafficked machines continuously generate substantial amounts of coin dust which necessitates constant servicing of the filters. Not only does this increase maintenance costs, but machine down time as well.

In addition to the above problems, it is sometimes necessary in gaming machine design to position critical components in isolated or confined locations. When these critical components are heat sensitive, this restricted placement may diminish the cooling efficiency of the box fan 3.

Accordingly, in view of the foregoing, it would be desirable to provide an alternative technique to cool the internal components of a gaming machine while isolating these components from the dust generated during use.

DISCLOSURE OF INVENTION

To achieve the foregoing, the present invention provides a cooling system for use with a gaming machine. The cooling system channels air from outside the gaming machine to internal components therein. The cooling system includes an air flow assembly which draws fresh air from outside the gaming machine. The air flow assembly provides the fresh air to a set of ducts. The set of ducts channel the fresh air to one or more internal components of the gaming machine. The cooling system may also include an inlet duct to channel air from outside the machine to the air flow assembly.

Advantageously, the present invention provides fresh air to internal components of a gaming machine. The fresh air has substantially less exposure to the coin dust of the gaming machine. Correspondingly, the risk of component failure from coin dust contamination is reduced. In addition, the fresh air is provided at a lower temperature than the ambient air within the gaming machine, thus improving cooling of the internal components.

The cooling system may also include a filtering system having one or more filters. The filters may be flexibly located to perform different filtering functions or extracting different particles from the air. In one embodiment, a filter is placed near the coolant air inlet from outside the gaming machine. This inlet filter may be directed to removing particles found outside the gaming machine. In another embodiment, a filter is implemented with a duct servicing an internal component and directed to filter particulates for the internal component.

The duct system of the present invention also allows improved control of the volume of air delivered to the internal components. In addition, the flexibility of the duct system allows improved ability to cool components that are located in spaces too confined to contain a fan. The duct system also allows for easy access to filters, thus allowing easier maintenance. The reduction of coin dust in the filter by using coolant air from outside the gaming machine may also increase the time interval between filter maintenance.

In one aspect, the present invention relates to a cooling system for use with a gaming machine, the gaming machine having a housing to enclose internal components therein. The cooling system including an air flow assembly adapted to drive air through a manifold thereof. The cooling system also including a duct system defining an air flow passage in flow communication with the manifold. The passage has an intake port positioned to draw ambient air from outside the gaming machine housing and an exhaust port terminating at least one internal component of the gaming machine for direct cooling thereof by the outside ambient air.

In another aspect, the present invention relates to a gaming machine. The gaming machine has a housing to enclose internal components therein. The gaming machine also including a display capable of presenting the outcome of a game play on the gaming machine. The gaming machine further includes a cooling system. The cooling system including an air flow assembly adapted to drive air through a manifold thereof, and a duct system defining an air flow passage in flow communication with the manifold. The passage having an intake port positioned to draw ambient air from outside the gaming machine housing and an exhaust port terminating at least one internal component of the gaming machine for direct cooling thereof by the outside ambient air.

In yet another aspect, the invention relates to a method of cooling the internal components of a gaming machine enclosed in a housing thereof. The method includes channeling ambient air from outside the housing through an air flow passage having an exhaust port terminating at least one internal component of gaming machine. The method also includes driving the outside ambient air through the passage by an air flow assembly having a manifold in fluid communication with the passage for direct cooling thereof by the outside ambient air.

BRIEF DESCRIPTION OF THE DRAWINGS

The method and assembly of the present invention has other objects and features of advantage which will be more readily apparent from the following description of the Best Mode of Carrying Out the Invention and the appended claims, when taken in conjunction with the accompanying drawing, in which:

BEST MODE OF CARRYING OUT THE INVENTION

While the present invention will be described with reference to a few specific embodiments, the description is illustrative of the invention and is not to be construed as limiting the invention. Various modifications to the present invention can be made to the preferred embodiments by those skilled in the art without departing from the true spirit and scope of the invention as defined by the appended claims. It will be noted here that for a better understanding, like components are designated by like reference numerals throughout the various figures.

Figure 2:
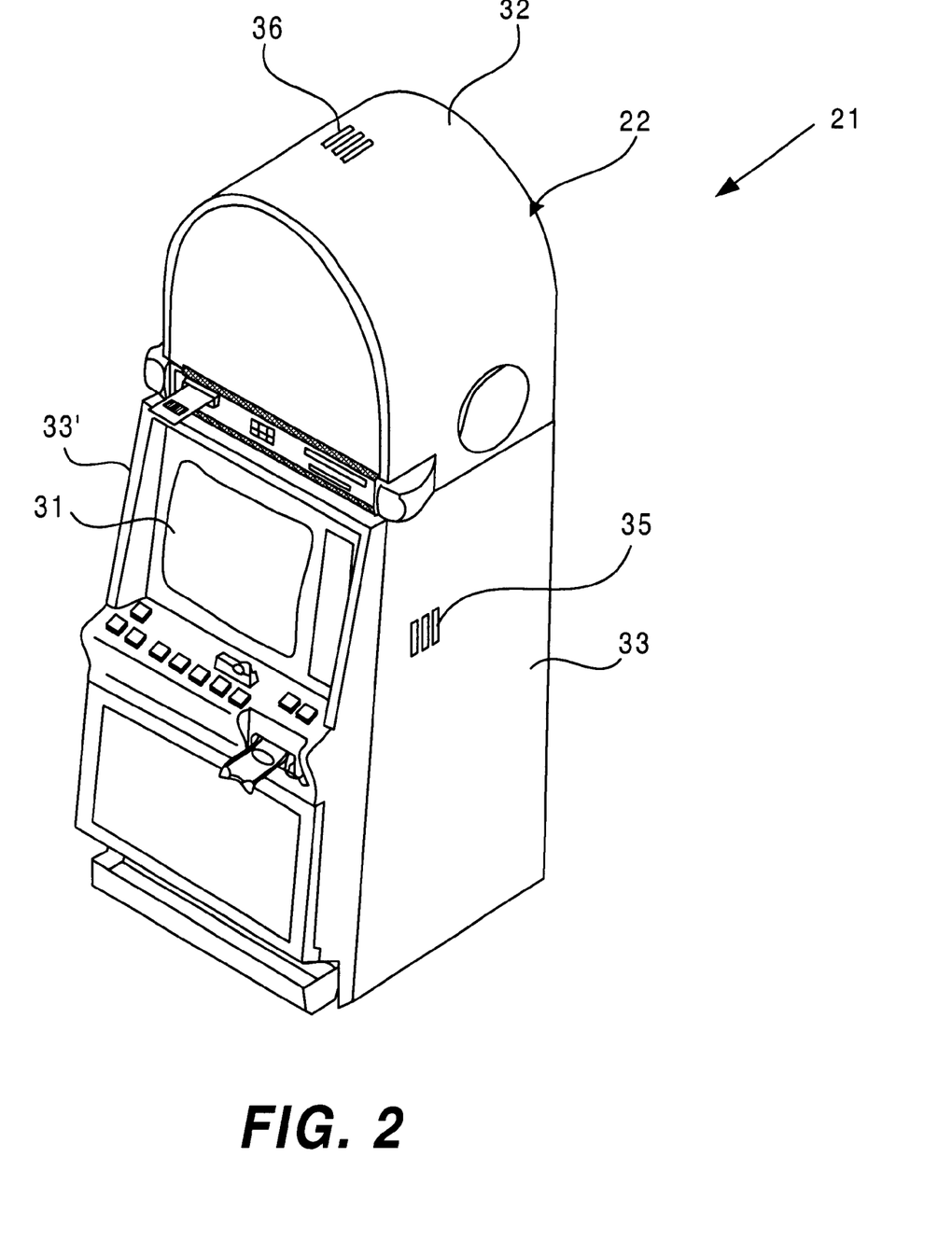
FIG. 2 is a top perspective view of a conventional gaming machine incorporating a cooling system designed in accordance with one embodiment of the present invention.
Figure 3:
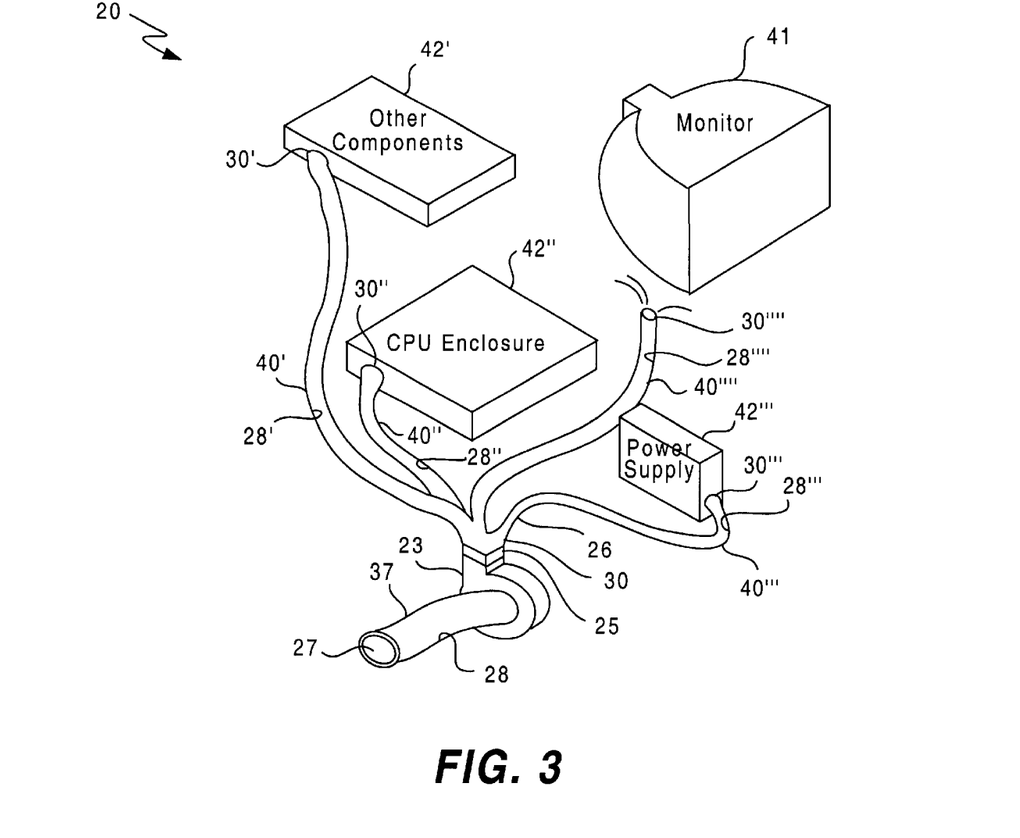
FIG. 3 is a diagrammatic illustration of one embodiment of the cooling system of the present invention.

Referring now to FIGS. 2 and 3, a cooling system 20 is provided for use with a gaming machine 21 having a housing 22 to enclose internal components (E.g., a power supply, a CPU, etc) therein. The cooling system 20 includes an air flow assembly, generally designated 23, adapted to drive air through a manifold 25 thereof. A duct or channel system which air can flow through, generally designated 26, defines an air flow passage 28 in flow communication with the manifold 25. The passage 28 includes an intake port 27 positioned to draw ambient air from outside the gaming machine housing 22 and an exhaust port 30 terminating at least one internal component of the gaming machine 21 for direct cooling thereof by the outside ambient air.

Accordingly, a cooling system is provided for a gaming machine which channels clean ambient coolant air from outside the gaming machine directly to the internal components requiring convective heat removal. Since this coolant air can be channeled directly to a targeted internal component, the coolant can be purposely diverted away from impinging other internal components in the gaming machine housing which may unduly influence the cooling efficiency. For example, in this configuration of the present invention, the coolant may neither be disadvantageously preheated through the flow past other upstream components nor accumulate and recirculate contaminants and particulates (E.g., coin dust) which increase the risk of damage to sensitive components.

As best depicted in FIG. 2, the gaming machine 21 includes a gaming machine housing 22 and a display 31. The display 31 may be a mechanical display such as a spinning reel display or a video display such as a CRT. Examples of games for which the results of a play may be displayed on a main video display include video slot games, electronic video poker card games, electronic keno games, electronic blackjack games, spinning reel slot games, etc. A spinning reel display includes a set of spinning reels which are typically stepper motor driven reel assemblies that each include a plurality of indicia or symbols on their periphery. If the indicia on the reels line up in a predetermined combination, the player is paid a jackpot.

The gaming machine housing 22 generally includes a front face as shown, as well as a top exterior surface 32 and a pair of side surfaces 33 and 33'. The top and side exterior surfaces 32, 33 and 33' may include vents 35 and 36, which will be described in greater detail below.

Attention is now directed to FIG. 3 where the cooling system 20 is illustrated for use with a gaming machine in accordance with one embodiment of the present invention. The cooling system 20 preferably includes an inlet duct 37 which defines the intake port 27 of passage 28 formed to receive ambient air from outside the gaming machine 21. The intake port 27 may be secured to the housing 22 of the gaming machine 21 and may be communicably coupled to one of the vents 35 and 36. In the preferred embodiment, the inlet duct 37 channels the coolant air to the air flow assembly 23 which then drives the ambient air from outside the gaming machine 21 (i.e., the coolant air) to the targeted internal components of the gaming machine 21 through a manifold 25.

Incidentally, the term "coolant air" refers to relatively clean coolant which has not been thermally or particularly contaminated by flowing through the gaming device housing. More particularly, the term "coolant air" generally refers to the ambient air drawn in from outside the gaming machine 21. Conversely, "interior air" refers to the air in the interior of the housing which is not flowing through the cooling system.

As above indicated, the cooling system 20 includes duct system 26 which preferably defines a plurality of flow passages 28'–28"" to distribute the coolant air from the inlet duct 37 and air flow assembly 23 directly to one or more internal components of the gaming machine 21 through manifold 25. By way of example, each flow passage 28'–28"" corresponds to a respective coolant duct 40'–40"" which in turn terminates, via a respective exhaust port 30'–30"", at a power supply 42", a monitor 41, a CPU 42", and other components, respectively. Other internal components may include lights, lighted displays, payout hopper motors, audio amplifiers, daughter cards for the CPU, etc., which are heat sensitive or produce substantial heat.

It will be appreciated that the flow passages 28 and 28'–28"" of the inlet duct 37 and coolant ducts 40'–40"" may be a passage of any suitable shape, cross sectional dimension or length for channeling air to the internal components within a gaming machine. Advantageously, these ducts are preferably flexible to enable positioning in the housing to route the ambient air to the individual targeted internal components which may be spaced about the gaming machine. Since space within a gaming machine may be limited due to alternate design priorities (e.g., appearance, minimizing game size), this flexibility allows routing of the ducts to cool internal components located at positions which are hard to access. The ducts may be made from any suitable composition and materials such as vacuum formed parts, rubber and plastic hoses and corrugated tubing, etc.

In one embodiment of the present invention, the exhaust port 30 may simply openly terminate at an internal component for cooling thereof (E.g., exhaust port"" at monitor 41 in FIG. 3). In this aspect of the present invention, with the air flow assembly manifold 25 being positioned between the air intake port 27 and the exhaust port 30, the air flow assembly 23 must be designed to generate a positive pressure in the passages 28'–28"" of the ducts 40'–40"" to drive ambient air into the cooling system. Consequently, the positive pressure causes the coolant air to be distributed from the exhaust port 30 onto a targeted internal component. During operation, moreover, the positive pressure prevents the inflow of "interior air" into the cooling system passages 28'–28"".

The cooling system 20 may also include an enclosure 42'–42"" for one or more of the internal components which is communicably coupled to a corresponding exhaust port 30'–30"". This enclosure may entirely surround the internal component, or may only enclose the portion thereof which requires cooling. By way of example, an enclosure 42' may provide a cavity formed for receipt of the entire CPU motherboard (not shown) therein. In effect, the enclosure isolates the targeted internal component of the gaming machine from the interior air of the housing 22 to provide thermal or coin dust protection. Thus, the coolant air is channeled from outside the gaming machine 21 through the inlet duct 37, the passage 28" and directly into the CPU enclosure 42" to cool the CPU therein. Subsequently, the coolant air is exhausted from the CPU enclosure 42".

To facilitate release of air after it has cooled the CPU, the CPU enclosure 42" may include vent holes (not shown). In this manner, the exhaust and coolant air, which has cooled the CPU, may now be applied as a coolant in the gaming machine housing to replace the interior air therein. As a result, other components which are less susceptible to particulate damage, such as lights, may benefit from air exhausted from the CPU enclosure 42". Alternatively, the cooling system may simply channel the exhausted air from the CPU enclosure 42" outside the gaming machine through an exhaust duct (not shown).

In one embodiment, the enclosures 42'–42"" may be completely sealed or isolated from the interior air inside the gaming machine housing 22. In addition, the ducts 40'–40"" may be sealed with the enclosure 42'–42"" to prevent air leakage at the joint between the exhaust ports 30'–30"" of the passage 28'–28"" and the coupling thereof to the enclosure cavity. In this manner, the coolant air may be supplied from the inlet duct 37 to the CPU enclosure 42" without intermixing with the interior air which may be preheated or may contain unwanted particulates (e.g., coin dust) present in the gaming machine.

It should be noted that the cooling system of the present invention need not require an enclosure for the internal component of the gaming machine. This is especially true when the system generates a positive pressure to drive the coolant air through the passages. By way of example, the exhaust port 30"" of passage 28"" of duct 40"" terminates directly at monitor 41 such that the coolant air is released in a general vicinity thereof. In the absence of an enclosure, the coolant air which has been introduced to the monitor 41 may now be applied within the gaming machine to cool other components.

In contrast, when the flow assembly 23 generates a negative pressure (to be discussed below) in passages 28'–28"" to generate an air flow at the respective exhaust ports 30'–30;", a respective enclosure 42'–42"" is required since the air flow assembly 23 is generally located downstream from the exhaust ports 30'–30"". Moreover, due to the nature of a negative pressure, both the passages 28'–28"" and the cavities in the enclosures 42'–42"" must be sealed to prevent the inflow of the interior air therein. Thus, an open ended exhaust port, such as CPU exhaust port 30"" in FIG. 3, could not be applied in a negative pressure environment.

While this configuration is not illustrated, a vacuum duct would be coupled between the cavity of the enclosure, and the manifold of the airflow assembly, downstream from the exhaust port. The airflow assembly would generate a vacuum, causing a negative pressure in the enclosure cavity. Thus, the ambient air would be drawn into the intake port 27 of the passage 28 and flow through the respective exhaust port 30'–30"". Subsequently, the coolant air would be drawn into the enclosure cavity, convectively impinge the internal component, and flow out of air flow assembly manifold through the vacuum duct (not shown).

In accordance with the present invention, the heat removal requirements may be customized to particular applications. By way of example, the air flow assembly 23 may be adapted to drive the coolant air through the passages 28'–28"" according to the heat removal requirements of one or more of the components of the gaming machine. More specifically, after considering the heat removal requirements of the power supply, for instance, the air density, the convective heat capacity of the air, as well as inlet and exhaust air temperatures may be determined to maintain a given temperature or temperature range for the power supply. Correspondingly, the airflow assembly 23 may be configured to provide an airflow through each individual passage 28'–28"" which maintains the particular temperature or temperature ranges of the respective component. The air flow assembly 23, however, must at least generate a minimum pressure difference, whether positive or negative, at the exhaust port to induce an air flow onto the internal component of the cooling system 20. For example, a minimum positive pressure of 1/100 psi may be generated by the airflow assembly to commence the flow of air therein between the manifold 25 and the exhaust end of the duct 40. In the preferred embodiment, the air flow assembly 23 is provided by a fan which may be altered in fan size and/or power to adjust the airflow.

The passages 28'–28"" of the ducts 40'–40"" may also be adapted to control the amount and/or proportion of coolant air flow provided to the internal components. It should be noted that adaptations to the duct system may be independently implemented between individual ducts. In one embodiment, the transverse cross-sectional dimension of a passage may be sized to control the rate of air flow provided to an internal component. Thus, a duct having a larger cross-sectional dimension may be used for an internal component which requires a greater degree of heat removal. In another embodiment, obstructions to the airflow may be placed within the ducts to re-apportion the airflow to internal components. By way of example, the air flow may be proportioned such that 60% of the air flow through the manifold 25 is directed to the power supply enclosure 42''', 30% is directed to the monitor 41, and 10% is directed to the CPU enclosure 42".

The ambient airflow properties of the air flowing through the cooling system may also be actively controlled. Such active control may be based on the operational temperature of one or more internal components within the gaming machine. Fan speed regulation, for instance, may be controlled based on the temperature of the CPU in the CPU enclosure 42". Thus, under heavy operation in hot climates, the air flow assembly 23 may be controlled to vary the airflow to the internal components in a manner increasing convective heat removal thereof. To provide feedback, a sensor may be used with the present invention. Air flow anemometers and thermocouples, for instance, are suitable for use with the present invention. The sensor may be strategically placed within the gaming machine to facilitate temperature regulation, e.g., within the power supply enclosure 42'''. A controller capable of active temperature may be included with the CPU located within the CPU enclosure 42". The sensor feedback may also be displayed on the monitor, LCD, spectrum, etc., for maintenance purposes.

Figure 4:
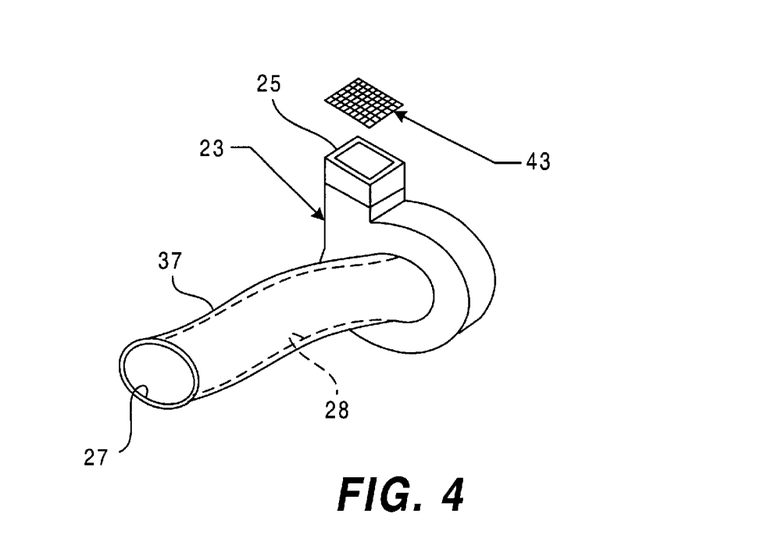
FIG. 4 is a diagrammatic illustration of an alternative embodiment to the cooling system of FIG. 3 incorporating an inlet filter.

Referring now to FIG. 4 the cooling system 20 may include one or more filters, generally designated 43, to filter the ambient air before it impinges the internal components. An air filter 43, for example, may be placed near the exhaust manifold 25 of the airflow assembly which allows a single filter to be used for the cooling system. It will be appreciated, however, that the filter 43 may be placed on an inlet side of the air flow assembly 23, as well.

The filter 43 may be designed to screen the ambient air entering the cooling system from outside the gaming machine. In one embodiment, the filter 43 may be selected to remove certain sized particulates such as sand, smoke and/or coin dust particles.

Figure 5:
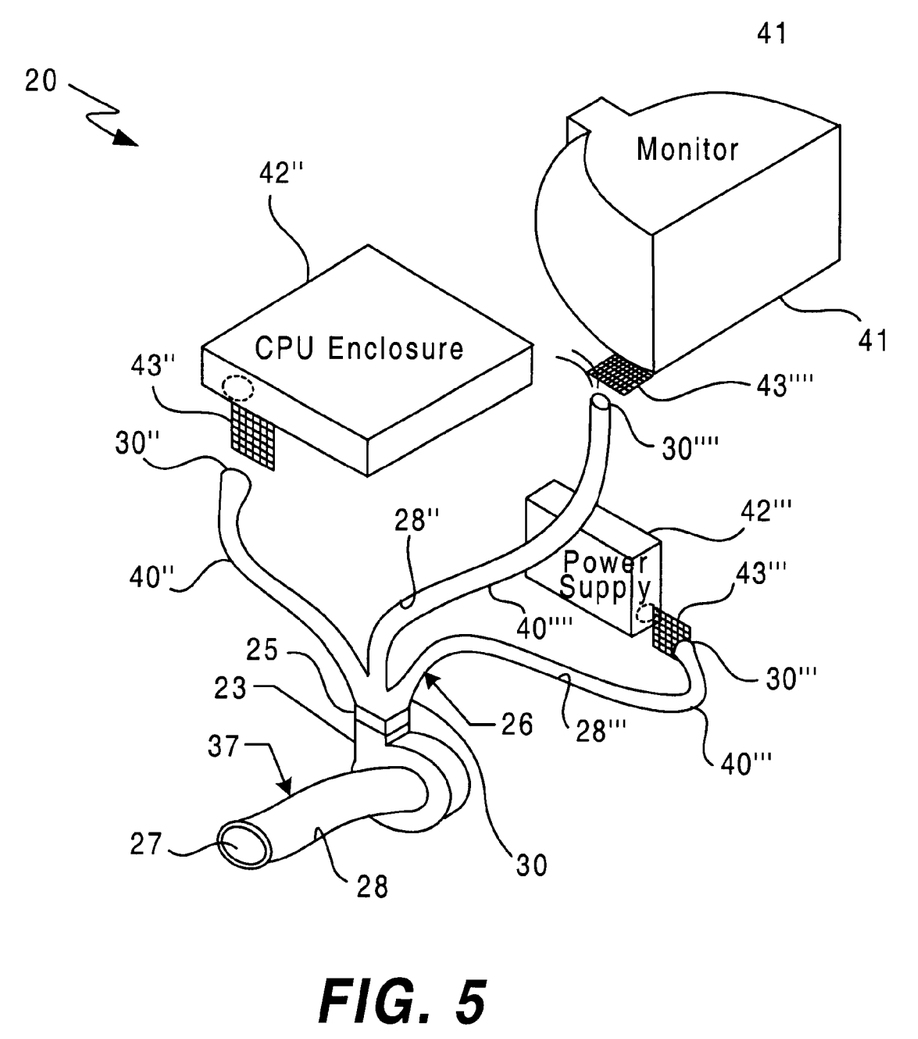
FIG. 5 is a diagrammatic illustration of a filtering system for use with the cooling system of FIG. 3 in accordance with another embodiment of the present invention.

FIG. 5 illustrates a filter system for the cooling system 20 in accordance with another embodiment of the present invention. The filter system includes multiple filters 43"–43"", each of which may be strategically located. For example, the filters 43"–43"" are positioned at the respective exhaust ports 30"–30"" of cooling system ducts for the power supply enclosure 42''', the monitor 41 and the CPU enclosure 42", respectively.

In this configuration, the individual filters of the filter system allow independent filtering for the internal components of the gaming machine. Thus, the filtering properties may be customized for each application, such as extracting specific particles. By way of example, if the cooling system 20 initially draws air from within the gaming machine, the particular filters may be chosen to prevent coin dust from passing through the duct. In another embodiment, a filter may be selected based on the common contaminates expected to be detrimental to an individual component. Alternatively, multiple filters may be installed in series for any of the internal components.

Using the duct system 26 of the present invention, the housing intake vent 35 and housing exhaust vent 36 (FIG. 2) may be located anywhere on the gaming machine 21. By extending or modifying the position of the intake port 27 of the inlet duct 37, the intake vent 35 and thus the air intake for the gaming machine may be located on any face of a gaming machine. Similar adaptations may be made to exhaust ducts to flexibly locate an exhaust vent. If exhaust ducts are not used to channel air from the enclosures to the exterior of the gaming machine, than the exhaust vent is preferably positioned in the upper portion of the gaming machine to facilitate release of hot and rising gases.

Typically, the inlet and outlet vents are located on the side faces of the gaming machine.

Advantageously, the present invention provides dedicated coolant air to the selected internal components of a gaming machine for cooling thereof. The dedicated coolant air has substantially less exposure to the other internal portions of the gaming machine. The risk of component failure from coin dust contamination is therefore substantially reduced. In addition, the coolant air is not pre-heated by other internal components of the gaming machine before reaching the desired internal component. Correspondingly, the coolant air is generally a lower temperature than the interior air within the gaming machine, thereby improving convective heat removal efficiency.

The duct system of the present invention also allows improved control of the volume of air delivered to the internal components. In addition, by manipulating the geometry of a duct, the present invention provides improved control of the direction of air delivered to the heat generating components. The flexibility of the duct system also allows improved ability to cool components that are located in confined spaces which may be too restrictive to implement a fan. Further, the duct system permits easy access to filters, thus simplifying maintenance. The reduction of coin dust in the filter by using fresh air from outside the gaming machine may also increase the intervals between filter cleaning.

Although the foregoing invention has been described in some detail for purposes of clarity of understanding, it will be apparent that certain changes and modifications may be practiced within the scope of the appended claims. For instance, although the specification has described a single cooling system for a gaming machine, the present invention may also use conventional fans in addition to the cooling system described. In this case, the conventional fans may be designed for general cooling the gaming machine while the cooling system of the present invention may be designed for cooling one or more particular internal components. In addition, although the air flow assembly has been described with respect to a fan, a blower or other suitable air flow assembly may be used. Further, the systems of this invention are not limited to conventional casino gaming machines and stations, but may include other machines such as amusement machines, televisions, vending machines, etc. In addition, the reader will understand that the gaming machines as described herein can be with gaming machines that are not necessarily located in a casino. Thus, in some embodiments, the gaming machines incorporating the cooling system of this invention may be stand-alone machines located in bars, drug stores, or other establishments.

What is claimed is:

1. A cooling system for use with a gaming machine having a housing to enclose internal components therein, said cooling system comprising:
    an air flow assembly adapted to drive air through a manifold thereof;
    a duct system defining an air flow passage in flow communication with said manifold, said passage having an intake port positioned to draw coolant therein and an exhaust port terminating at at least one internal component of the gaming machine for direct cooling thereof by the coolant air; and
    a feedback system coupled to the airflow assembly to actively control the air flow through the air flow passage based upon the operational temperature of one or more of the internal components.

2. The cooling system as defined in claim 1, wherein said intake port is positioned to draw ambient air from outside the gaming machine housing.

3. The cooling system as defined in claim 1, further including:
    an enclosure device defining a cavity in flow communication with said exhaust port, said cavity being formed and dimensioned to receive at least a portion of said one internal component to be cooled for substantial air flow isolation thereof from the environment in the gaming machine housing.

4. The cooling system as defined in claim 3, wherein the enclosure device is adapted to substantially extend around said internal component for substantially full enclosure thereof in said cavity.

5. The cooling system as defined in claim 3, wherein said manifold of the air flow assembly is positioned in flow communication with said passage between said intake port and said exhaust port.

6. The cooling system as defined in claim 5, wherein said air flow assembly is configured to generate a positive pressure in said cavity to substantially prevent air from in said housing from entering said cavity.

7. The cooling system as defined in claim 6, wherein the minimum positive pressure between the air pressure in said cavity and the internal pressure in said housing is at least about 1/100 psi.

8. The cooling system as defined in claim 3, wherein said manifold is coupled to and in flow communication with said cavity at a position downstream from said exhaust port.

9. The cooling system as defined in claim 8, wherein said air flow assembly is configured to generate a negative pressure at said exhaust port and in said cavity to draw the coolant air through said passage and onto said one internal component.

10. The cooling system as defined in claim 9, wherein the minimum negative pressure between the air pressure in said cavity and the internal pressure in said housing is at least about −1/100 psi.

11. The cooling system as defined in claim 1, further including:
    a filter device positioned in the flow path of the coolant air passing through said passage for filtering-out particles thereof prior to passing through said exhaust port.

12. The cooling system as defined in claim 11, wherein said filter device is positioned proximate to said intake port.

13. The cooling system as defined in claim 1, wherein said manifold of the air flow assembly is positioned in flow communication with said passage between said intake port and said exhaust port.

14. The cooling system as defined in claim 13, wherein said air flow assembly is configured to generate a positive pressure at said exhaust port to expel the coolant air in said passage onto said at least one internal component.

15. The cooling system as defined in claim 14, wherein the minimum positive pressure between the air pressure in said passage just upstream from said exhaust port and the internal pressure in said housing is at least about 1/100 psi.

16. The cooling system as defined in claim 15, wherein said air flow assembly includes an air blower device.

17. The cooling system as defined in claim 1, wherein said duct system includes a plurality of exhaust ports terminating at a plurality of internal components of the gaming machine for direct independent cooling of each thereof by the coolant air.

18. The cooling system as defined in claim 17, further including:
    a plurality of enclosure devices each defining a respective cavity in flow communication with a respective exhaust port, each said cavity being formed and dimensioned to receive at least a portion of a respective internal component for substantial air flow isolation thereof from the environment in the gaming machine housing.

19. The cooling system as defined in claim 18, wherein the transverse cross-sectional area of each exhaust port is sized to control the air flow through the respective internal compartment.

20. The cooling system as defined in claim 1, wherein said feedback system include a temperature sensor mounted in the housing.

21. A gaming machine having a housing to enclose internal components therein, the gaming machine comprising:
    a display capable of presenting the outcome of a game play on the gaming machine;
    a cooling system including an air flow assembly adapted to drive air through a manifold thereof, and a duct system defining an air flow passage in flow communication with said manifold, said passage having an intake port positioned to draw ambient air from outside the gaming machine housing and an exhaust port terminating at least one internal component of the gaming machine for direct cooling thereof by the outside ambient air; and
    a feedback system coupled to the airflow assembly to actively control the air flow through the air flow passage based upon the operational temperature of the one internal component.

22. The gaming machine as defined in claim 19, further including:
    a filter device positioned in the flow path of the ambient air passing through said passage for filtering-out particles thereof prior to passing through said exhaust port.

23. The gaming machine as defined in claim 19, wherein said manifold of the air flow assembly is positioned in flow communication with said passage between said intake port and said exhaust port.

24. The gaming machine as defined in claim 23, wherein said air flow assembly is configured to generate a positive pressure at said exhaust port to expel the ambient air in said passage onto said at least one internal component.

25. The gaming machine as defined in claim 19, further including:
an enclosure device defining a cavity in flow communication with said exhaust port, said cavity being formed and dimensioned to receive at least a portion of said one internal component to be cooled for substantial air flow isolation thereof from the environment in the gaming machine housing.

26. The gaming machine as defined in claim 25, wherein said manifold is coupled to and in flow communication with said cavity at a position downstream from said exhaust port.

27. The gaming machine as defined in claim 19, wherein said duct system includes a plurality of exhaust ports terminating at a plurality of internal components of the gaming machine for direct independent cooling of each thereof by the outside ambient air.

28. The gaming machine as defined in claim 27, further including:
a plurality of enclosure devices each defining a respective cavity in flow communication with a respective exhaust port, each said cavity being formed and dimensioned to receive at least a portion of a respective internal component for substantial air flow isolation thereof from the environment in the gaming machine housing.

29. The gaming machine as defined in claim 28, wherein the transverse cross-sectional area of each exhaust port is sized to control the air flow through the respective internal compartment.

30. The gaming machine as defined in claim 21, wherein said feedback system include a temperature sensor mounted in the housing.

31. A method of cooling the internal components of a gaming machine enclosed in a housing thereof, said method comprising:
channeling coolant air through an air flow passage having an exhaust port terminating at at least one internal component of the gaming machine;
driving the coolant air through said passage by an air flow assembly having a manifold in fluid communication with said passage for direct cooling thereof by the coolant air; and
actively controlling the air flow through the air flow passage based upon the operational temperature of the one internal component.

32. The method as defined in claim 31, further including:
substantially isolating at least a portion of said one internal component to be cooled from the environment in the gaming machine while enabling flow communication with said exhaust port.

33. The method as defined in claim 32, wherein said isolating includes enclosing the at least a portion of said one internal component in a cavity defined by an enclosure, said cavity being in flow communication with said exhaust port.

34. The method as defined in claim 23, wherein said driving, includes generating a positive pressure by said air flow assembly in said cavity to substantially prevent air from in said housing from entering said cavity.

35. The method as defined in claim 34, wherein the minimum positive pressure between the air pressure in said cavity and the internal pressure in said housing is at least about 1/100 psi.

36. The method as defined in claim 31, further including:
filtering the coolant air passing through said passage prior to passing through said exhaust port.

37. The method as defined in claim 33, wherein said driving includes generating a positive pressure by said air flow assembly at said exhaust port to expel the coolant air in said passage onto said one internal component.

38. The method as defined in claim 37, wherein the minimum positive pressure between the air pressure in said cavity and the internal pressure in said housing is at least about 1/100 psi.

39. The method as defined in claim 33, further including:
filtering the coolant air passing through said passage prior to passing through said exhaust port.

* * * * *